US012641733B2

(12) United States Patent
    Kitahara et al.

(10) Patent No.: US 12,641,733 B2
(45) Date of Patent: May 26, 2026

(54) ELECTRONIC COMPONENT MOUNTING STRUCTURE AND METHOD FOR MANUFACTURING SAME

(71) Applicant: Murata Manufacturing Co., Ltd., Kyoto (JP)

(72) Inventors: Takashi Kitahara, Nagaokakyo (JP); Kensuke Otake, Nagaokakyo (JP); Kyo Shin, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 279 days.

(21) Appl. No.: 18/335,383

(22) Filed: Jun. 15, 2023

(65) Prior Publication Data

US 2023/0328895 A1      Oct. 12, 2023

Related U.S. Application Data

(63) Continuation of application No. PCT/JP2021/047951, filed on Dec. 23, 2021.

(30) Foreign Application Priority Data

Dec. 28, 2020      (JP) ................................. 2020-219147

(51) Int. Cl.
    *H05K 3/34*         (2026.01)
    *H05K 1/181*         (2026.01)
    (Continued)

(52) U.S. Cl.
    CPC ........... *H05K 3/3436* (2013.01); *H05K 1/181* (2013.01); *H05K 3/346* (2026.01)

(58) Field of Classification Search
    CPC ........ H05K 3/34; H05K 3/3436; H05K 3/346; H05K 1/181
    (Continued)

(56) References Cited

U.S. PATENT DOCUMENTS

2014/0356055 A1      12/2014   Nakano et al.
2021/0249335 A1*      8/2021   Krutsch .............. H01L 23/4922

FOREIGN PATENT DOCUMENTS

JP          H05-308179 A       11/1993
JP          2005-005494 A       1/2005
                (Continued)

OTHER PUBLICATIONS

International Search Report for PCT/JP2021/047951 dated Mar. 15, 2022.

*Primary Examiner* — Tremesha W Burns
(74) *Attorney, Agent, or Firm* — McDonald Hopkins LLC

(57) ABSTRACT

The present disclosure is directed to an electronic component mounting structure including: a circuit board provided on a surface thereof with a first electrode containing Cu as a main component; and an electronic component mounted on the circuit board, the electronic component including a second electrode on a surface thereof; wherein the second electrode includes a first plating containing Ni as a main component and a second plating containing Sn as a main component formed on a surface of the first plating, and an intermediate bonding layer is provided between the first plating and the first electrode, and the intermediate bonding layer includes a first region containing an alloy of Cu and Sn as a main component and a second region containing Sn as a main component.

4 Claims, 4 Drawing Sheets

(51) Int. Cl.
*H05K 3/341* (2026.01)
*H05K 3/346* (2026.01)

(58) Field of Classification Search
USPC .......................................................... 361/767
See application file for complete search history.

(56) References Cited

FOREIGN PATENT DOCUMENTS

| | | | |
|---|---|---|---|
| JP | 2006-324629 | A | 11/2006 |
| WO | 2013/132942 | A1 | 9/2013 |

\* cited by examiner

Fig. 2A
Fig. 2B
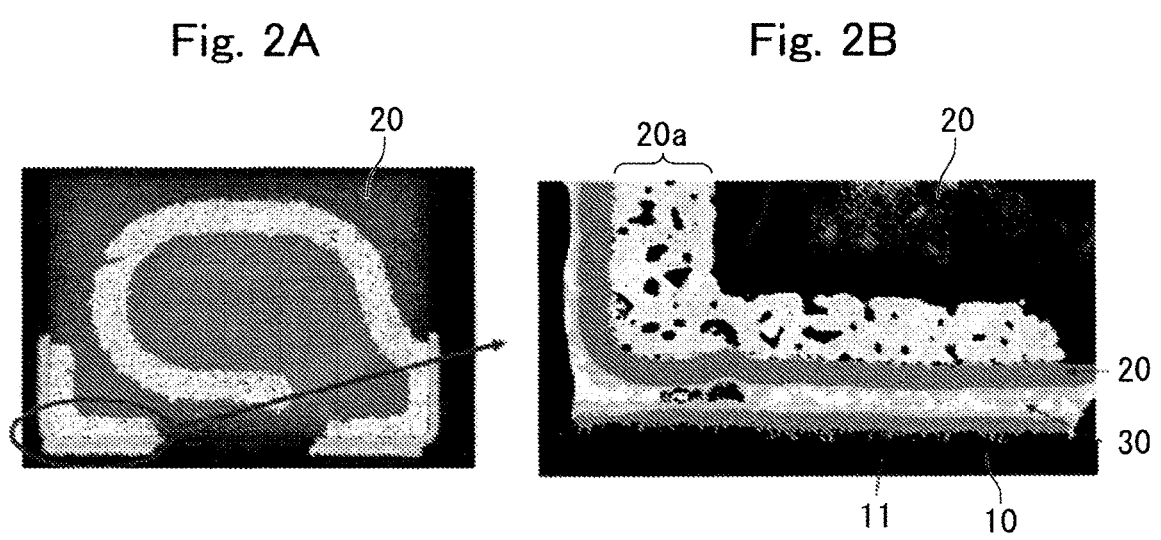
Fig. 2C
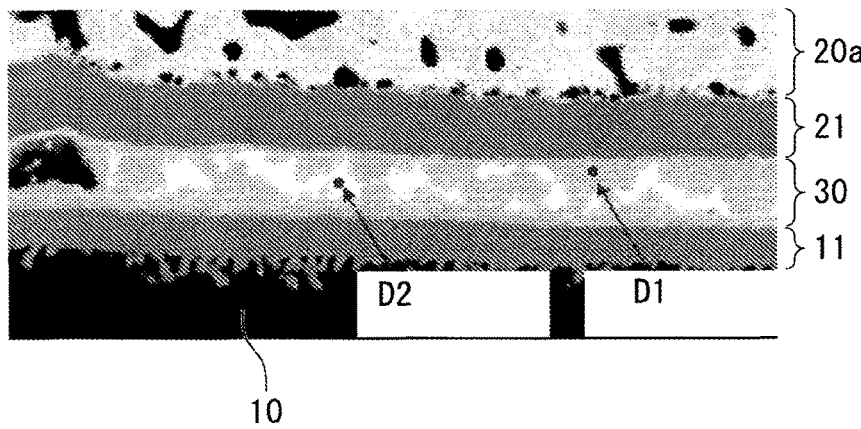
Fig. 2D
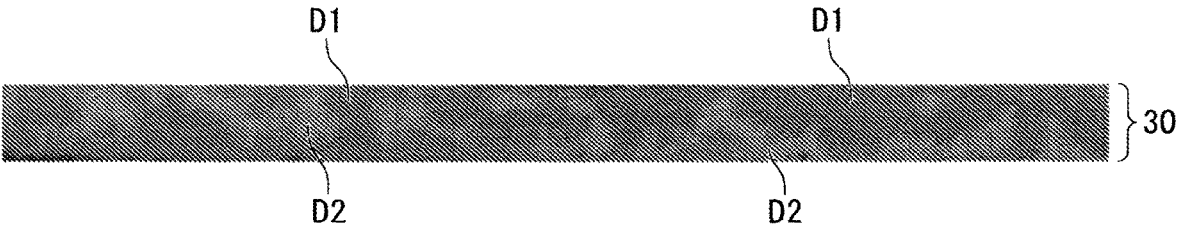

1

ELECTRONIC COMPONENT MOUNTING STRUCTURE AND METHOD FOR MANUFACTURING SAME

CROSS-REFERENCE OF RELATED APPLICATIONS

This application is a continuation of International Patent Application No. PCT/JP2021/047951, filed on Dec. 23, 2021, which claims the benefit of Japanese Patent Application No. 2020-219147, filed on Dec. 28, 2020, the contents all of which are incorporated herein by reference.

BACKGROUND OF THE DISCLOSURE

Field of the Disclosure

The present disclosure relates to an electronic component mounting structure used for mounting an electronic component on a circuit board. In addition, the present disclosure relates to a method for manufacturing the electronic component mounting structure.

Description of the Related Art

Patent Document 1 discloses a method for mounting a surface mount component by mounting and soldering a surface mount device (SMD) on a copper foil pattern formed on a printed circuit board.

When solder containing lead is used, there is a concern about an influence on human bodies and natural environments. Therefore, lead-free solder containing no lead has been used in recent years.

The melting point of the lead-free solder (for example, Sn/Ag/Cu) is 217° C., which is relatively low. A module completed by mounting an electronic component on a circuit board using such a lead-free solder and coating the circuit board with a mold resin may be further mounted on a motherboard by reflow soldering. At this time, the lead-free solder included in the module is remelted by the heat of reflow soldering, and flows into the interface between the circuit board and the mold resin due to a capillary action, so that a short circuit may occur between the conductors. Such a phenomenon is referred to as "solder splash".

Patent Document 1: JP H5-308179 A (1993)

BRIEF SUMMARY OF THE DISCLOSURE

A possible benefit of the present disclosure is to provide an electronic component mounting structure capable of reducing such a solder splash at the time of mounting on a motherboard.

In addition, a possible benefit of the present disclosure is to provide a method for manufacturing such an electronic component mounting structure.

One aspect of the present disclosure is an electronic component mounting structure including: a circuit board provided on a surface thereof with a first electrode containing Cu as a main component; and an electronic component mounted on the circuit board, the electronic component including a second electrode on a surface thereof; wherein the second electrode includes a first plating containing Ni as a main component and a second plating containing Sn as a main component formed on a surface of the first plating, and an intermediate bonding layer is provided between the first plating and the first electrode, and the intermediate bonding layer includes a first region containing an alloy of Cu and Sn as a main component and a second region containing Sn as a main component.

A method for manufacturing an electronic component mounting structure according to another aspect of the present disclosure includes steps of: preparing a circuit board provided on a surface thereof with a first electrode containing Cu as a main component; preparing an electronic component including a second electrode on a surface thereof, the second electrode including a first plating containing Ni as a main component and a second plating containing Sn as a main component formed on a surface of the first plating; applying a flux to a surface of one or both of the first electrode and the second plating; mounting the electronic component on the circuit board and bringing the first electrode and the second plating into contact with each other; and heating the circuit board and the electronic component to form an intermediate bonding layer between the first electrode and the first plating, the intermediate bonding layer including a first region containing an alloy of Cu and Sn as a main component and a second region containing Sn as a main component.

According to the present disclosure, the solder splash at the time of mounting on a motherboard can be reduced.

BRIEF DESCRIPTION OF THE SEVERAL VIEWS OF THE DRAWINGS

FIG. 2A is an image obtained by observing a cross section of the electronic component 20 bonded to the circuit board 10 using a scanning electron microscope (SEM); FIG. 2B is an enlarged image of the bonded portion; FIG. 2C is an enlarged image of a first electrode 11, an intermediate bonding layer 30, and a second plating 22; FIG. 2D is an image in which edge enhancement is performed by applying image processing to a part of the intermediate bonding layer 30;

DETAILED DESCRIPTION OF THE DISCLOSURE

Figure 1A:
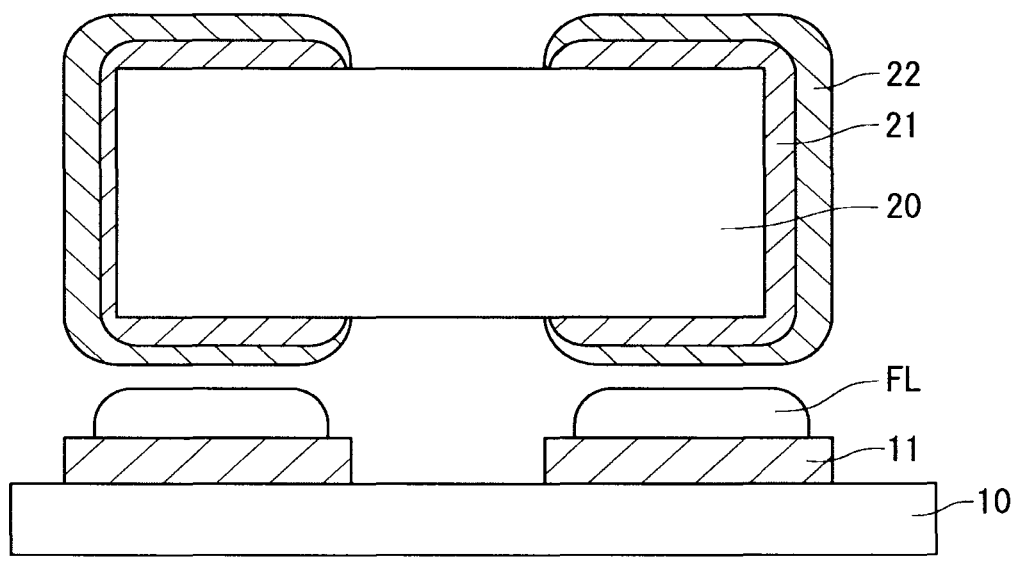
FIG. 1A is a cross-sectional view showing configurations of a circuit board and an electronic component according to a first embodiment of the present disclosure.

One aspect of the present disclosure is an electronic component mounting structure including: a circuit board provided on a surface thereof with a first electrode containing Cu as a main component; and an electronic component mounted on the circuit board, the electronic component including a second electrode on a surface thereof; wherein the second electrode includes a first plating containing Ni as a main component and a second plating containing Sn as a main component formed on a surface of the first plating, and an intermediate bonding layer is provided between the first plating and the first electrode, and the intermediate bonding layer includes a first region containing an alloy of Cu and Sn as a main component and a second region containing Sn as a main component.

According to this configuration, the melting point of the intermediate bonding layer is made relatively high. As a result, the solder splash at the time of mounting on a motherboard can be reduced.

In the present disclosure, an alloy of Ni and Sn may be provided between the first plating and the second plating.

According to this configuration, the bonding strength between the first plating and the second plating is increased by the presence of the alloy of Ni and Sn between the first plating and the second plating.

In the present disclosure, when a cross section of the intermediate bonding layer is observed, a ratio between an area of the first region and an area of the second region may be in a range of 40%:60% to 70%:30%.

According to this configuration, the melting point of the intermediate bonding layer is made higher than 217° C., and the bonding strength of the intermediate bonding layer can also be secured to a practical numerical value.

A method for manufacturing an electronic component mounting structure according to another aspect of the present disclosure includes steps of: preparing a circuit board provided on a surface thereof with a first electrode containing Cu as a main component; preparing an electronic component including a second electrode on a surface thereof, the second electrode including a first plating containing Ni as a main component and a second plating containing Sn as a main component formed on a surface of the first plating; applying a flux to a surface of one or both of the first electrode and the second plating; mounting the electronic component on the circuit board and bringing the first electrode and the second plating into contact with each other; and heating the circuit board and the electronic component to form an intermediate bonding layer between the first electrode and the first plating, the intermediate bonding layer including a first region containing an alloy of Cu and Sn as a main component and a second region containing Sn as a main component.

According to this configuration, the melting point of the intermediate bonding layer is made relatively high. As a result, the solder splash at the time of mounting on a motherboard can be reduced.

First Embodiment

Figure 1B:
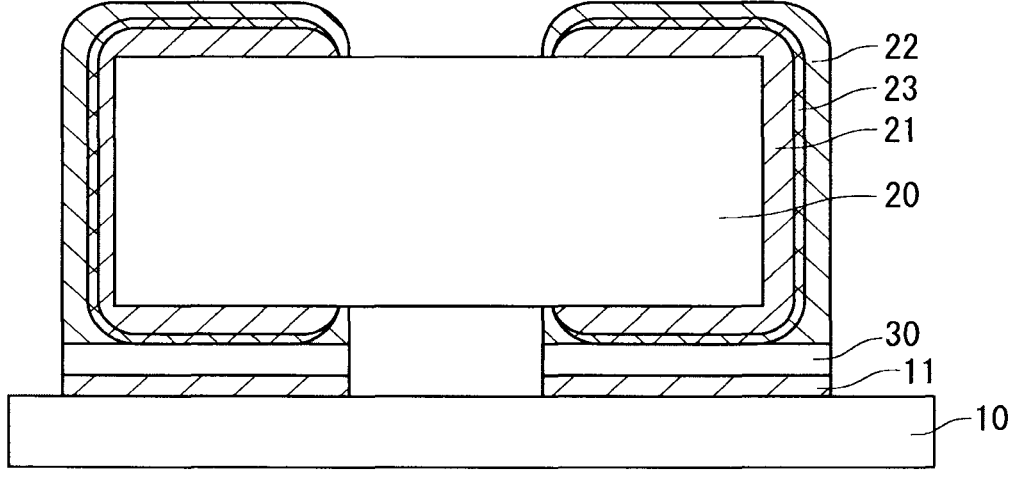
FIG. 1B is a cross-sectional view showing a configuration of an electronic component mounting structure according to the first embodiment of the present disclosure.

FIG. 1A is a cross-sectional view showing configurations of a circuit board and an electronic component according to a first embodiment of the present disclosure. FIG. 1B is a cross-sectional view showing a configuration of an electronic component mounting structure according to the first embodiment of the present disclosure.

A description will be given along a procedure for manufacturing the electronic component mounting structure. First, as shown in FIG. 1A, a circuit board 10 and an electronic component 20 are prepared. The circuit board 10 may be formed of an electrically insulating material, such as an epoxy resin-impregnated glass fiber cloth, ceramics, a fluororesin, a polyimide resin, or a polyester resin. A first electrode 11 working as a circuit conductor is provided on the surface of the circuit board 10.

The first electrode 11 is formed of a conductive material containing Cu as a main component, and may be, for example, a Cu single layer, or a multilayer conductive layer of a Cu layer and various metals, for example, a metal layer of Ni, Au, or the like. In the case of such a multilayer conductive layer, the uppermost layer may be a Cu layer, and Sn plating may be provided thereon. The thickness of the first electrode 11 is set in a range of, for example, 5 to 30 µm.

The electronic component 20 is, for example, a capacitor, an inductor, a resistor, an integrated circuit, or the like, and here, a surface mount device (SMD) type ceramic component is exemplified. The electronic component 20 has a component electrode 20a (see FIGS. 2A to 2D) connected to an internal device, and here, a case where two respective component electrodes 20a are provided near the left and right end surfaces is exemplified. On the surface of each of the component electrodes 20a, as a second electrode, a first plating 21 containing Ni as a main component and a second plating 22 containing Sn as a main component formed on the surface of the first plating 21 are provided. The thickness of the first plating 21 is set to, for example, a range of 2 to 10 µm. The thickness of the second plating 22 is set to, for example, a range of 2 to 10 µm.

Here, the phrase "containing X as a main component" means that the metal or alloy having the largest mass % in the metal composition is X. In addition, the term "plating" is a type of surface treatment, which means a method of coating a metal thin film on a surface of a metal or non-metal material or the metal thin film itself, and for example, electroless plating, electrolytic plating, hot dip plating, or vacuum plating (vacuum deposition, sputtering, ion plating) can be used.

Next, a flux FL is applied onto the first electrode 11 before the electronic component 20 is placed on the circuit board 10. The flux FL has a function of removing oxides and harmful substances generated during metal welding and a function of holding electronic components, and for example, rosin (pine resin), polyalkylene glycol, glycerin, and the like can be used. The flux FL may be applied to the surface of one or both of the first electrode 11 and the second plating 22.

Next, the electronic component 20 is mounted on the circuit board 10 using a chip mounter or the like, and the first electrode 11 and the second plating 22 are brought into contact with each other.

Next, the circuit board 10 on which the electronic component 20 is mounted is put into a heating furnace, and then the circuit board 10 and the electronic component 20 are heated. When the temperature in the furnace reaches a predetermined temperature, as shown in FIG. 1B, the flux FL evaporates, and a part of the first electrode 11 and a part of the second plating 22 are melted and alloyed, so that the intermediate bonding layer 30 is formed between the first electrode 11 and the first plating 21. In this way, the electronic component 20 and the circuit board 10 are mechanically and electrically bonded.

The intermediate bonding layer 30 includes a first region containing an alloy of Cu and Sn as a main component and a second region containing Sn as a main component. In addition, the interface between the first plating 21 and the second plating 22 of the electronic component 20 is also partially alloyed, and then the alloy layer 23 of Ni and Sn is formed.

Figure 3:
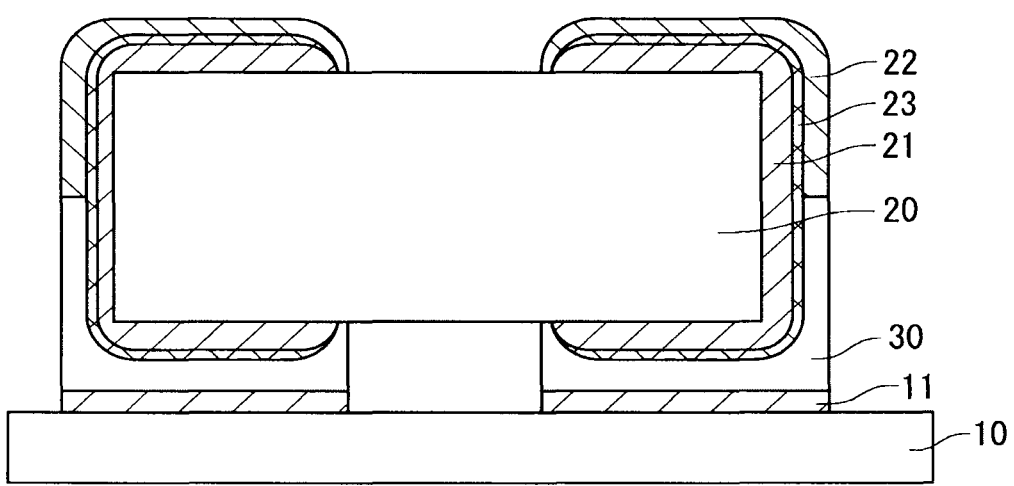
FIG. 3 is a cross-sectional view showing another configuration of an electronic component mounting structure according to the first embodiment of the present disclosure.
Figure 4:
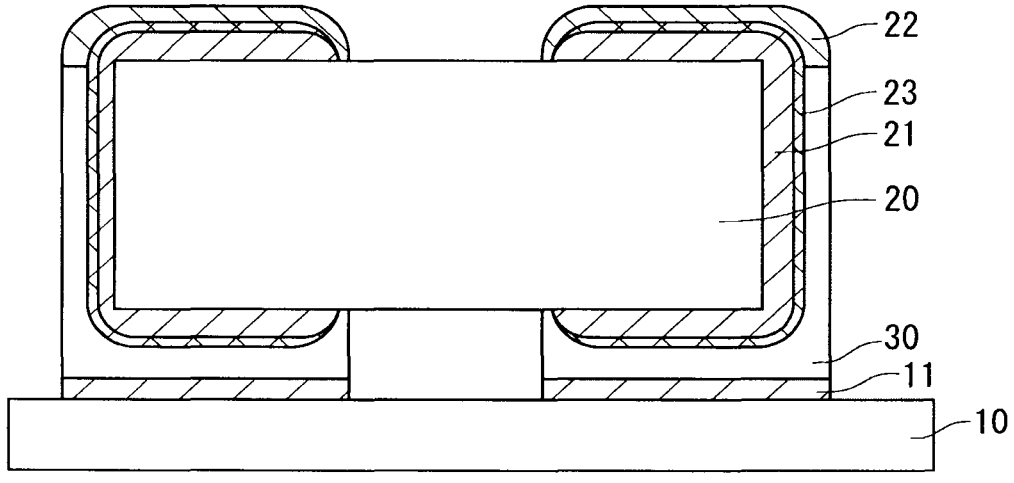
FIG. 4 is a cross-sectional view showing still another configuration of an electronic component mounting structure according to the first embodiment of the present disclosure.
Figure 5:
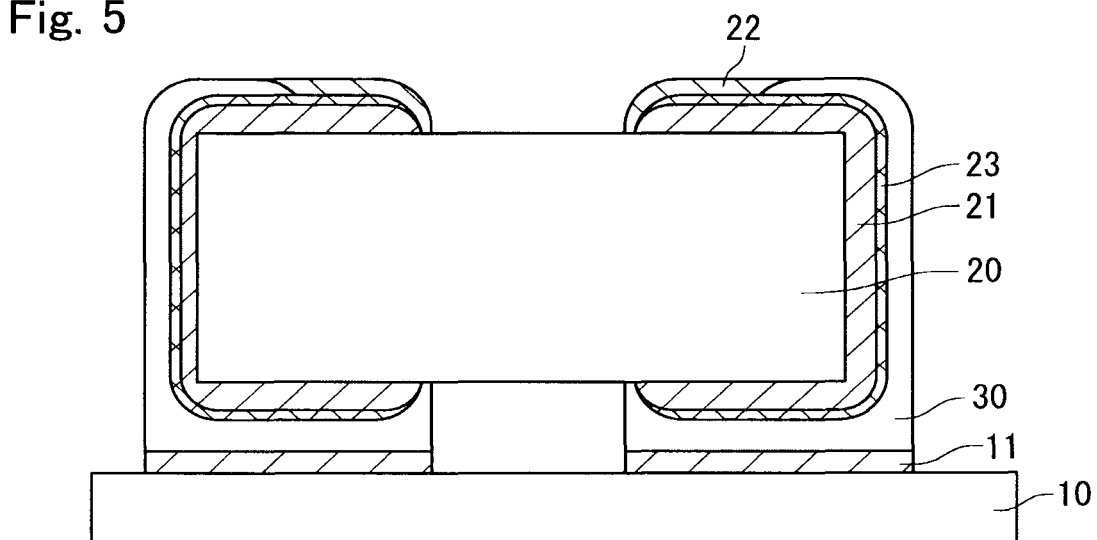
FIG. 5 is a cross-sectional view showing yet another configuration of an electronic component mounting structure according to the first embodiment of the present disclosure.

FIGS. 3 to 5 are cross-sectional views showing various configurations of electronic component mounting structures according to the first embodiment of the present disclosure. The intermediate bonding layer 30 shown in FIG. 3 extends from the bottom surface to about half the height of the side surface as compared with FIG. 1B. The intermediate bonding layer 30 shown in FIG. 4 extends from the bottom surface to the entire side surface as compared with FIG. 1B.

The intermediate bonding layer 30 shown in FIG. 5 extends from the bottom surface through the entire side surface to about a half of the top surface as compared with FIG. 1B.

FIG. 2A is an image obtained by observing a cross section of the electronic component 20 bonded to the circuit board 10 using a scanning electron microscope (SEM). FIG. 2B is an enlarged image of the bonded portion. FIG. 2C is an enlarged image of the first electrode 11, the intermediate bonding layer 30, and the second plating 22. FIG. 2D is an image in which edge enhancement is performed by applying image processing to a part of the intermediate bonding layer 30.

As shown in FIGS. 2A and 2B, a case where the electronic component 20 is an inductor is exemplified, and a conductor is wound in a coil shape inside the ceramic bulk, and one end thereof is connected to the component electrode 20a. The conductor and the component electrode 20a are formed of, for example, sintered metal of Cu or Ag, and are observed as porous materials in the image.

The respective component electrodes 20a are provided in an L-shape at the lower left corner and the lower right corner of the electronic component 20. A first plating 21 is formed in an L-shape on an outer surface of the component electrode 20a. The first electrode 11 of the circuit board 10 is positioned below the first plating 21. The intermediate bonding layer 30 is positioned between the first electrode 11 and the first plating 21. It should be noted that although an alloy layer 23 of Ni and Sn is present on the outer surface of the first plating 21, the thickness thereof is considerably small and is not shown in the image.

As shown in FIGS. 2C and 2D, the intermediate bonding layer 30 includes a first region D1 (dark gray) containing an alloy of Cu and Sn as a main component and a second region D2 (light gray) containing Sn as a main component. Since the first region D1 contains a large amount of Cu component, the reflectance in SEM observation is low, and the first region D1 looks darker than the second region D2. Since the second region D2 has a high ratio of alloying of Cu and Sn, the second region D2 has a higher reflectance and looks brighter than the first region D1.

In addition, the melting point of Sn is 240° C., and the melting point of the $Cu_6Sn_5$ alloy is 415° C., which are higher than the melting point (217° C.) of the lead-free solder. As a result, when the module including the circuit board 10 mounted with the electronic component 20 is mounted on the motherboard by reflow soldering, the intermediate bonding layer 30 is less likely to be remelted, and the solder splash can be reduced.

The compositions of the first region D1 and the second region D2 can be measured using energy dispersive X-ray analysis (EDX). Table 1 below shows an example of measurement results.

TABLE 1

| ELEMENT | FIRST REGION D1 (percent by mass) | SECOND REGION D2 (percent by mass) |
|---|---|---|
| C | 8.0 | 5.2 |
| N | 1.6 | 3.3 |
| O | 5.2 | 6.5 |
| Al | 0.7 | 0.6 |
| Si | 2.0 | 1.9 |
| Ni | 4.2 | 1.3 |

TABLE 1-continued

| ELEMENT | FIRST REGION D1 (percent by mass) | SECOND REGION D2 (percent by mass) |
|---|---|---|
| Cu | 30.4 | 3.8 |
| Ag | 0 | 0 |
| Sn | 48.1 | 77.6 |

Next, the ratio between the area S1 of the first region D1 and the area S2 of the second region D2 can be calculated from the image in FIG. 2D using an area calculation software. As a result, S1:S2=60%:40% was obtained. The area ratio S1:S2 is preferably, for example, in a range of 40%:60% to 70%:30%, and accordingly, the melting point of the intermediate bonding layer is higher than 217° C., and the bonding strength of the intermediate bonding layer 30 can also be secured to a practical numerical value.

The present disclosure is industrially remarkably useful in that the solder splash at the time of mounting on a motherboard can be reduced.

10 circuit board
11 first electrode
20 electronic component
20a component electrode
21 first plating
22 second plating
23 alloy layer
30 intermediate bonding layer
D1 first region
D2 second region
FL flux

The invention claimed is:

1. An electronic component mounting structure comprising:
   a circuit board having a first electrode, the first electrode being provided on a surface of the circuit board and containing Cu as a main component; and
   an electronic component mounted on the circuit board and having a second electrode, the second electrode being provided on a surface of the electronic component;
   wherein the second electrode includes a first plating containing Ni as a main component and a second plating containing Sn as a main component, the second plating being formed on a surface of the first plating, and
   an intermediate bonding layer is provided between the first plating and the first electrode, and
   the intermediate bonding layer includes a first region containing an alloy of Cu and Sn as a main component and a second region containing Sn as a main component.

2. The electronic component module according to claim 1, wherein an alloy of Ni and Sn is provided between the first plating and the second plating.

3. The electronic component module according to claim 1, wherein, when a cross section of the intermediate bonding layer is observed, a ratio between an area of the first region and an area of the second region is in a range of 40%:60% to 70%:30%.

4. The electronic component module according to claim 1, wherein the intermediate bonding layer extends i) from a bottom surface of the electronic component to about half a height of a side surface of the electronic component, ii) from the bottom surface to an entirety of the side surface, or iii) from the bottom surface through the entirety of the side surface to about a half of a top surface of the electronic component.

* * * * *